(12) United States Patent
Kumar et al.

(10) Patent No.: US 10,692,581 B2
(45) Date of Patent: Jun. 23, 2020

(54) CIRCUITS FOR BLEEDING SUPPLY VOLTAGE FROM A DEVICE IN A POWER DOWN STATE

(71) Applicant: Microchip Technology Incorporated, Chandler, AZ (US)

(72) Inventors: Ajay Kumar, Phoenix, AZ (US); Yemi Omole, Gilbert, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 38 days.

(21) Appl. No.: 15/873,812

(22) Filed: Jan. 17, 2018

(65) Prior Publication Data

US 2018/0204626 A1  Jul. 19, 2018

Related U.S. Application Data

(60) Provisional application No. 62/447,799, filed on Jan. 18, 2017.

(51) Int. Cl.
G11C 16/30 (2006.01)
G11C 16/26 (2006.01)
G11C 5/14 (2006.01)

(52) U.S. Cl.
CPC .............. *G11C 16/30* (2013.01); *G11C 5/143* (2013.01); *G11C 5/147* (2013.01); *G11C 5/148* (2013.01); *G11C 16/26* (2013.01)

(58) Field of Classification Search
CPC ............................. G11C 16/30; G11C 13/0038
USPC .................................................... 365/185.25
See application file for complete search history.

(56) References Cited

U.S. PATENT DOCUMENTS

| | | | |
|---|---|---|---|
| 5,587,866 A * | 12/1996 | Yach | G11C 5/143 361/90 |
| 5,778,238 A * | 7/1998 | Hofhine | G11C 5/143 713/340 |
| 6,084,446 A | 7/2000 | Chen et al. | 327/143 |
| 6,901,012 B2 * | 5/2005 | Ikehashi | G11C 5/143 365/189.05 |
| 2002/0135379 A1 * | 9/2002 | Moreaux | G01R 31/043 324/500 |
| 2004/0263222 A1 | 12/2004 | Tseng et al. | 327/143 |
| 2005/0213387 A1 | 9/2005 | Kubo et al. | 365/185.21 |
| 2009/0096506 A1 * | 4/2009 | Ogiwara | G11C 5/143 327/530 |
| 2012/0099392 A1 * | 4/2012 | Shim | G11C 16/30 365/226 |
| 2015/0117115 A1 | 4/2015 | Lee | 365/185.25 |

OTHER PUBLICATIONS

International Search Report and Written Opinion, Application No. PCT/US2018/014176, 14 pages, dated Jun. 22, 2018.

* cited by examiner

Primary Examiner — Hoai V Ho
Assistant Examiner — Muna A Techane
(74) Attorney, Agent, or Firm — Slayden Grubert Beard PLLC

(57) ABSTRACT

Embodiments of the present disclosure include an apparatus. The apparatus includes a voltage supply line, a sense circuit coupled to the voltage supply line, and a bleeder circuit. The sense circuit is configured to sense a voltage level of the voltage supply line. The bleeder circuit is configured to bleed a remaining charge available on a capacitor when the voltage level reaches a device threshold voltage. The device threshold voltage arises from a device connected to the apparatus.

13 Claims, 5 Drawing Sheets

CIRCUITS FOR BLEEDING SUPPLY VOLTAGE FROM A DEVICE IN A POWER DOWN STATE

PRIORITY

This application claims priority to U.S. Provisional Patent 62/447,799, filed Jan. 18, 2017, the contents of which are hereby incorporated by reference.

FIELD OF THE INVENTION

The present disclosure relates to power management circuits, for example, for memory, and, more particularly, to circuits for bleeding supply voltage from an electronic device to define states in a power down state to ensure a predefined valid state at start-up.

BACKGROUND

When power is removed from an electronic device, such as a Flash memory module other forms of retention modules, voltages at one or more points in the device can remain at an undesirable level which can result in an unpredictable behavior or states. For example, in the case of a Flash memory module, a voltage can remain on the supply line (e.g., the VDD input line) after power is no longer being actively supplied from outside of the device. Voltage drops with leakage or active current to an undesirable voltage can result when the voltage falls near or below the threshold voltage (Vth) for operating gates of transistors in the module (e.g., about 700-900 mV for some CMOS transistors used in 3.3 V logic gates), where transistor operating behavior is not well guaranteed. This may leave no way to maintain a defined state in an electronic device. The problem may become more severe as devices have very low leakage near Vth of the transistors and thus the undefined state can remain on any electronic device for a very long time. In a periodic environmental monitoring system application, it may happen that device wakes again before supply is completely discharged and it may find itself in one of those undefined state.

One potential solution is to use an off-chip controller to connect the supply line to ground after power is disconnected. However, this requires an off-chip controller to properly connect the supply line to ground every time power is disconnected. Not only does this require an extra step when using the chip, but this too could fail if power is suddenly lost by the off-chip controller.

SUMMARY

Embodiments of the present disclosure include circuits for bleeding supply voltage from a device in a power down state that operate automatically when power is removed from the supply line.

In accordance with some embodiments of the disclosed subject matter, circuits for bleeding supply voltage from a device in a power down state are provided.

In accordance with some embodiments of the disclosed subject matter, a charge bleeder circuit is provided, the circuit comprising: a resistor having a first side coupled to a voltage supply line of a Flash memory module; a first transistor having a first terminal coupled to the second side of the resistor; a second transistor having a first terminal coupled to a second terminal of the first transistor, a second terminal coupled to ground, and a gate coupled to an output of a control circuit via a coupling capacitor, wherein the second transistor has a threshold voltage that is substantially less than the threshold voltage of transistors in the Flash memory module; and the control circuit having an input coupled to the voltage supply line, wherein the control circuit is configured to: detect that a voltage on the voltage supply line is less than or equal to about the threshold voltage of transistors in the flash memory module; in response to detecting that the voltage on the voltage supply line is less than or equal to about the threshold voltage, output a voltage that causes a channel to open in the second transistor allowing current to flow between the voltage supply line and ground; detect that a voltage on the voltage supply line is greater than about the threshold voltage of transistors in the flash memory module; and in response to detecting that the voltage on the voltage supply line is greater than the threshold voltage, output a voltage that causes the channel in the second transistor to close, inhibiting current flow between the voltage supply line and ground.

Embodiments of the present disclosure may include an apparatus with a voltage supply line, a sense circuit coupled to and configured to sense a voltage level of the voltage supply line, and a bleeder circuit configured to bleed a remaining charge available on a capacitor when the voltage level reaches a device threshold voltage. The device threshold voltage may arise from a device connected to the apparatus. In combination with any of the above embodiments, the apparatus may further include a control circuit coupled to the sense circuit and the bleeder circuit. In combination with any of the above embodiments, the control circuit may be configured to detect that a value of the voltage supply line is less than or equal to the device threshold voltage, and, in response, output a control signal configured to allow current to flow between the voltage supply line and ground. The control signal may be to a second resistor. In combination with any of the above embodiments, the control circuit may be configured to detect that a voltage on the voltage supply line is greater than the device threshold voltage of transistors in the device, and in response, output a control signal configured to inhibit current flow between the voltage supply line and ground. In combination with any of the above embodiments, the sense circuit and the control circuit may be implemented within a same circuit. In combination with any of the above embodiments, the control circuit includes a Schmitt trigger. In combination with any of the above embodiments, the bleeder circuit may include a resistor including a first side coupled to the voltage supply line, a first transistor having a first terminal coupled to a second side of the resistor, and a second transistor having a first terminal coupled to a second terminal of the first transistor, and a second terminal coupled to ground. In combination with any of the above embodiments, the second transistor may include a transistor threshold voltage that is less than the device threshold voltage. In combination with any of the above embodiments, the second transistor may include a gate communicatively coupled to an output of the control circuit. In combination with any of the above embodiments, the gate of the second transistor may be communicatively coupled to the output of the sense circuit through a coupling capacitor. In combination with any of the above embodiments, the first transistor may be a medium voltage native transistor with a very low threshold voltage. In combination with any of the above embodiments, the second transistor may be a low voltage transistor.

In combination with any of the above embodiments, embodiments of the present disclosure may include a flash memory for implementing the device. The flash memory may include a device threshold voltage for an on/off state. The apparatus may include a decoupling capacitor. The voltage supply line may be connected to the flash memory and the decoupling capacitor. The bleeder circuit may be configured to bleed a remaining charge available on the decoupling capacitor. In combination with any of the above embodiments, the sense circuit may be configured to determine a state of the flash memory based on the voltage level of the voltage supply line. In combination with any of the above embodiments, the bleeder circuit may be configured to bleed the remaining charge available on the decoupling capacitor when the flash memory is in an off state. In combination with any of the above embodiments, the bleeder circuit may be configured to preserve the remaining charge available on the decoupling capacitor when the flash memory is in an on state. In combination with any of the above embodiments, the bleeder circuit may be configured to preserve a read/write state of the flash memory depending upon the on/off state of the flash memory as detected through the voltage supply line.

Embodiments of the present disclosure may include methods performed by any of the apparatuses of the embodiments described above.

DETAILED DESCRIPTION

Figure 1:
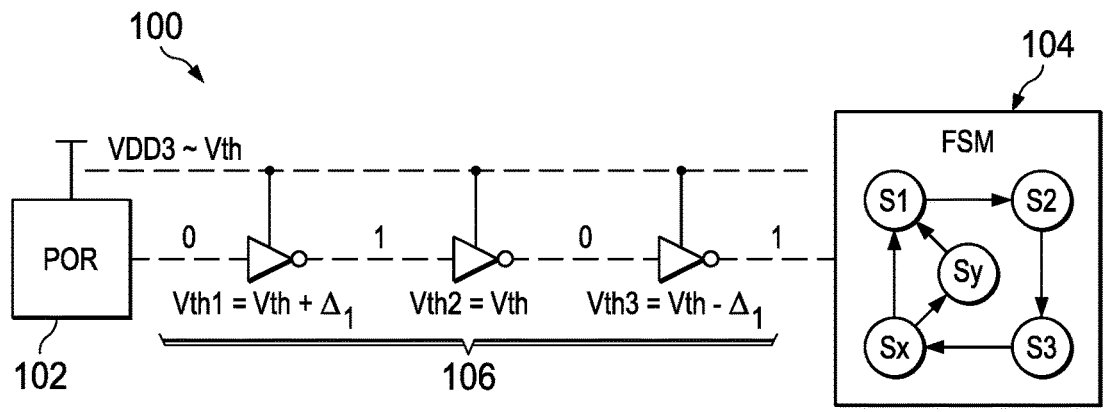
FIG. 1 shows an example of a power-on reset circuit that can be used in setting a finite state machine into a reset state, in accordance with embodiments of the present disclosure.

An operational state (e.g., read, write, erase, etc.) of a Flash memory module can be controlled based on the current state of one or more finite state machines. When power is first applied to the module, a power-on reset signal can be applied which can cause the finite state machine(s) to enter a predetermined state. FIG. 1 shows circuit 100 with a power-on reset ("POR") circuit 102 that can be used in setting values through delay elements or a buffer 106 to operate a finite state machine 104, according to embodiments of the present disclosure. Any suitable number and kind of buffer 106 over a long routing, as well as arrangements thereof, may be used to produce a desired functionality or mapping within finite state machine 104. When power is first applied at power up, POR circuit 102 can output a signal that causes finite state machine 104 to enter a reset state. Successive states may store reset or set signals. However, if the voltage on the supply line remains near Vth, the power-on reset operation can fail, and the state of finite state machine 104 can remain in a state other than reset (e.g., write, erase, etc.).

There may be an inherent mismatch between any two transistors on a same die. Those mismatch results in mismatch in threshold voltage of a transistor. The smaller the transistor, the bigger the mismatch may be. Digital buffers may be built using the smallest channel length transistors available. Thus, these may often suffer from large mismatch in the associated threshold voltages. When a power supply comes close to a typical threshold voltage of a transistor, then a logic 'L' coming out of POR can be interpreted as logic '1', as based on mismatch some buffers along the path may be ON and some may be completely OFF. Thus, a reset state which is defined in this embodiment as 'L' can be interpreted as active as it was read 'H'. The same can happen to any flops or inverters in a state-machine where a combination logic can interpret some 'L' as 'H' or 'H' as 'L'.

Figure 2:
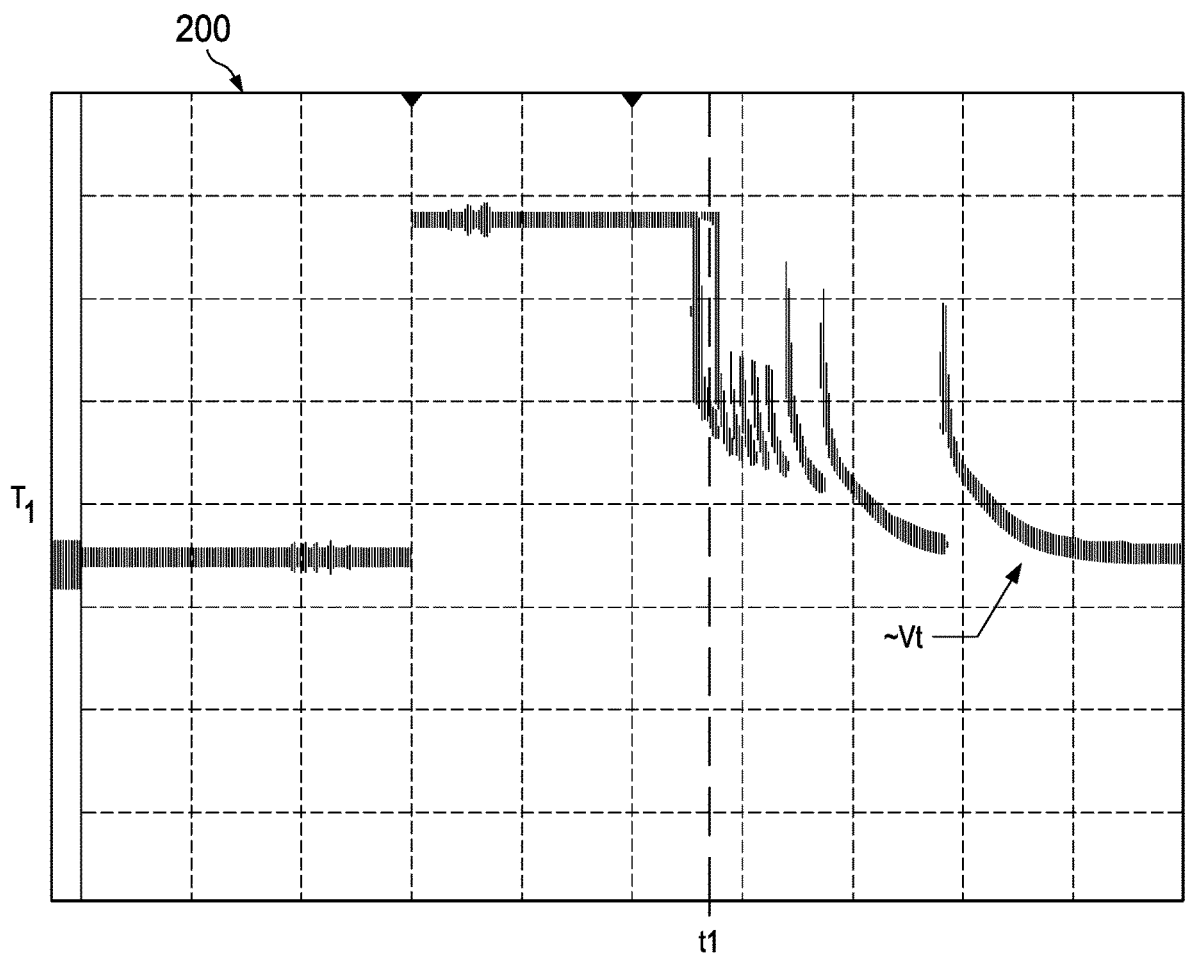
FIG. 2 shows an example of a timing diagram of voltage on a supply line of an electronic device in which power is removed from the supply line.

FIG. 2 shows an example of a timing diagram 200 of voltage on a supply line of another solution. In example 200, a Flash memory module has power removed from the supply line at time t1. As shown in FIG. 2, the voltage on the supply line decreases from the voltage (e.g., VDD) while power is being supplied. However, rather than continuing to fall, the voltage on the supply line settles into a steady state at about Vth (shown as Vt) as leakage starts to diminish.

Figure 3:
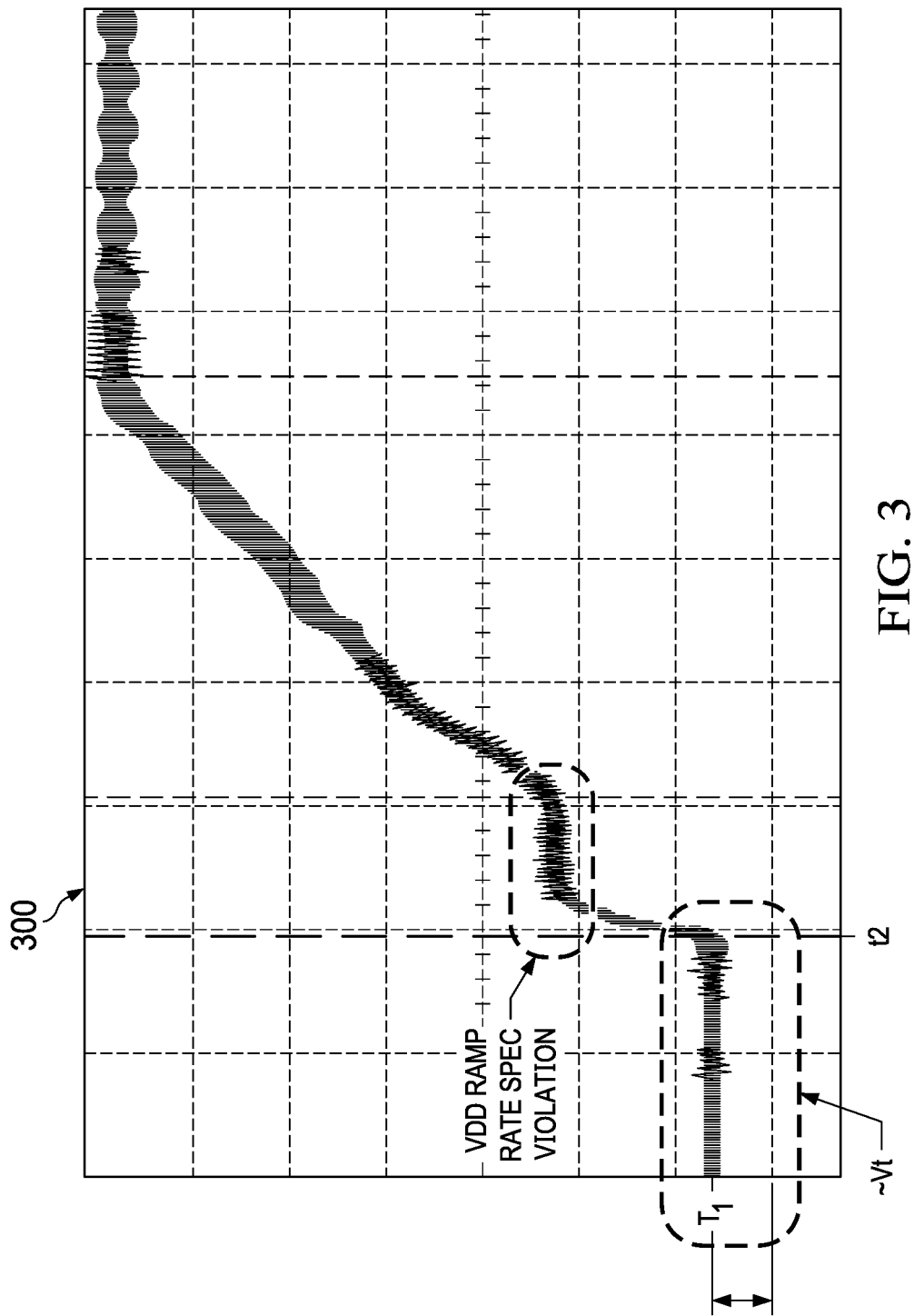
FIG. 3 shows an example of a timing diagram of voltage on a supply line of an electronic device module in which power is restored to the supply line, in accordance with embodiments of the present disclosure.

FIG. 3 shows an example 300 of a timing diagram of voltage on a supply line of yet another solution for a Flash memory module (e.g., after power was removed at t1) in which power is supplied to the supply line at time t2. As shown in FIG. 3, the voltage on the supply line is already at Vth when power is supplied, and begins to increase at time t2. This may occur as the device starts to consume current at a voltage greater than Vt. Thus, current supplied by source is the total consumed by the devices before the source starts to overdrive the load current and voltage starts to build.

Figure 4:
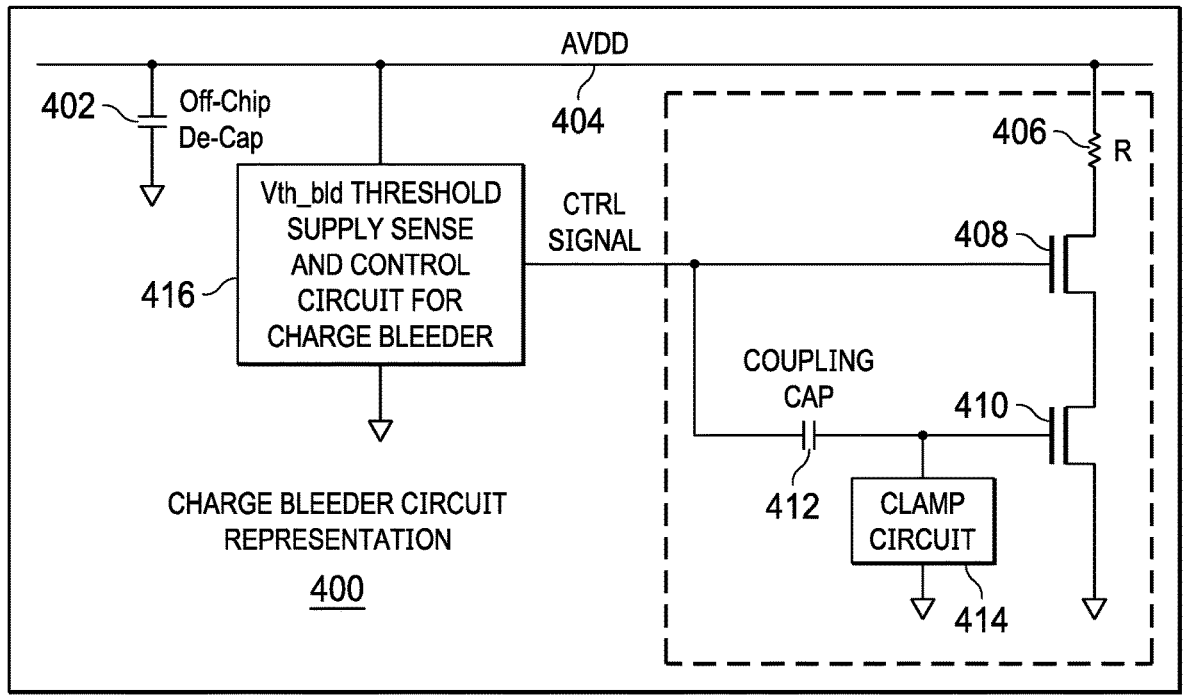
FIG. 4 shows an example of a circuit for bleeding supply voltage from a device in a power down state that operates automatically when power is removed from the supply line, in accordance with embodiments of the present disclosure.

FIG. 4 shows an example of a circuit 400 for bleeding supply voltage from a device in a power down state that operates automatically when power is removed from the supply line, according to embodiments of the present disclosure.

Circuit 400 may include, or may be activated or connected to, a decoupling capacitor 402. Decoupling capacitor via a supply line 404. In one embodiment, decoupling capacitor 402 can be provided by the design of a printed circuit board (PCB) to which circuit 400 is connected such that the PCB acts as a decoupling capacitor. In another embodiment, a capacitor can be connected between supply line 404 and ground to provide the decoupling capacitance.

In one embodiment, circuit 400 may include a resistor 406. Resistor 406 may be connected between supply line 404 and a first transistor 408. The value of resistor 406 may be selected such that the current flowing through resistor 406 is limited based on the specifications of transistor 408 or a second transistor 410 that provide a connection between supply line 404 and ground. For example, resistor 408 can have a resistance value such that the current flowing through resistor 406 is limited to a value between 5 milliamps (mA) and 50 mA. As another example, resistor 406 can have any suitable resistance value that creates a current that is suitable for transistor 408 and transistor 410.

In one embodiment, a first terminal of transistor 408 (e.g., the source terminal) may be electrically connected to resistor 406. A second terminal of transistor 408 (e.g., the drain terminal) may be electrically connected to a first terminal of transistor 410. Additionally, a third terminal of transistor 408 (e.g., the gate terminal) may be electrically connected to a control circuit 416 to receive a control signal for operating transistor 408. Transistor 408 can be implemented using any suitable technique or combination of techniques. For example, transistor 408 can be implemented as a medium voltage native transistor (e.g., having a very low threshold voltage).

A depletion or native mode device may be, by default, on. Consequently, use of the device may require additional operation to turn it off. Conversely, an enhancement mode device may be, by default, off. Consequently, user of the device may require additional operation to turn it on. Regulator transistors in semiconductor devices may be implemented in enhancement mode a Vth of approximately 600 mV. Thus, an always-on transistor 408 may be used to bleed the charge. Circuit 400 may be configured to prevent the charge from continuing to bleed during regular operation. Thus, circuit 400 may include a low voltage (such as 1.2V) core transistor 410 which has, for example, a 250 mV threshold. The drain of transistor 410 might not withstand more than 1.2V. However, the power supply might reach as high as 3.63V. Accordingly, in one embodiment, transistor 408 is implemented as a native transistor to act as a protection device for transistor 410. In another embodiment, transistor 408 may be implemented as a zero-threshold voltage device, which requires a positive threshold voltage implementation of transistor 410, such that a bleeding path can be broken when it is not needed.

In one embodiment, a first terminal of transistor 410 (e.g., the source terminal) may be electrically connected to the second terminal of transistor 408, and a second terminal of transistor 410 (e.g., the drain terminal) may be electrically connected to ground. Additionally, a third terminal of transistor 410 (e.g., the gate terminal) may be electrically connected to control circuit 416 to receive a control signal for operating transistor 410. Transistor may be implemented using any suitable technique or combination of techniques. For example, transistor 410 can be implemented as a low voltage transistor (e.g., having a threshold voltage significantly lower than Vth).

In one embodiment, a coupling capacitor 412 may be be connected between control circuit 416 and transistor 410. In another embodiment, a clamp circuit 414 can be connected between the signal line connecting the gate of transistor 410 to control circuit 416 and ground. Clamp circuit 414 may be connected between coupling capacitor 412 and ground. Clamp circuit 414 may be implemented by any suitable combination of analog or digital circuitry. A secondary ESD clamp may be used to protect the gate voltage of a low-voltage transistor 410. In such a case, the secondary ESD clamp may limit below the breakdown of the core transistor gate voltage. Clamp circuit 414 may be configured to clamp or limit the upper or lower extreme of a waveform to a fixed DC voltage level. Clamp circuit 414 may be constructed with a positive or negative polarity. Clamp circuit 414 may be biased or unbiased. When unbiased, clamp circuit 414 may fix a voltage lower limit or upper limit to, for example, 0 Volts. Clamp circuit 414 may be configured to clamp a peak of a waveform to a specific DC level compared with a capacitively coupled signal which swings about its average DC level. This signal may be the signal routed to the gate of transistor 410. A positive clamp circuit (negative peak clamper) may output a purely positive waveform from an input signal; it offsets the input signal so that all of the waveform is greater than 0 V. A negative clamp may output a purely negative waveform from an input signal. A bias voltage between the diode and ground may offset the output voltage by that amount.

Control circuit 416 may be configured to provide a control signal to operate transistor 410 when the voltage on supply line 404 falls near Vth, such as approximately 200 mV near Vth. Control circuit 416 may be configured to receive the voltage from supply line 404 as an input. Furthermore, control circuit 416 may be configured to use the voltage on supply line 404 as a supply. When the voltage on supply line 404 is significantly above Vth (e.g., while power is being supplied to supply line 404), control circuit 416 may be configured to output a signal that is below the voltage threshold of transistor 410, causing transistor 410 to act as an open switch. Such a significant amount above Vth may be, for example, two times Vth. When the voltage on supply line 404 drops near Vth, however, control circuit 416 may be configured to output a control signal with a voltage that is at least the threshold voltage of transistor 410. This may cause transistor 410 to act as a closed switch. As a result, current may flow through resistor 406, transistor 408, and transistor 410 between supply line 404 and ground. This may reduce the voltage on supply line 404 to significantly below Vth. This may be as low as, for example, approximately 200 mV below the Vth of NMOS transistors.

Control circuit 416 may be implemented using any suitable technique or combination of techniques to implement the functionality of this disclosure. Control circuit 416 may be implemented by analog circuitry, digital circuitry, instructions for execution by a processor, or any suitable combination thereof. For example, control circuit 416 can be implemented using an specialized Schmitt trigger with its input connected to supply configured to output a low value (e.g., below the threshold voltage of transistor 410) when the voltage on supply line 404 is significantly above Vth, and output a high value (e.g., above the threshold voltage of transistor 410) when the voltage on supply line 404 falls near Vth. A fixed small current source connected to the drain of the NMOS transistor with the NMOS gate connected to supply may be used. When the supply is near zero, the current source thus pulls the output to positive rail. When the supply goes above Vth, the NMOS may overcome the current from the current source and pull the output to ground. Because control circuit 416 may be configured to operate when power is no longer being supplied to supply line 404, any supply voltages or reference voltages for active components within control circuit 416 are below the normal operating voltage that is supplied on supply line 404.

In one embodiment, circuit 400 can be integrated into a Flash memory module such that circuit 400 is an integral part of the Flash memory module. In another embodiment, circuit 400 can be coupled to a supply line that feeds a Flash memory module (e.g., circuit 400 can be installed on a printed circuit board on which the Flash memory module is also installed). Any suitable number of instances of circuit 400 can be used in connection with a particular electronic device. For example, an instance of circuit 400 can be connected to each supply line in a Flash memory module.

Although transistors 408 and 410 are shown in FIG. 4, circuit 400 can be configured with any suitable transistor or combination of transistors that can be controlled using a voltage less than the threshold voltage of transistors used in the Flash memory module, and that will not fail when the normal supply line voltage (e.g., 3.3 volts) is present on the supply line.

Figure 5:
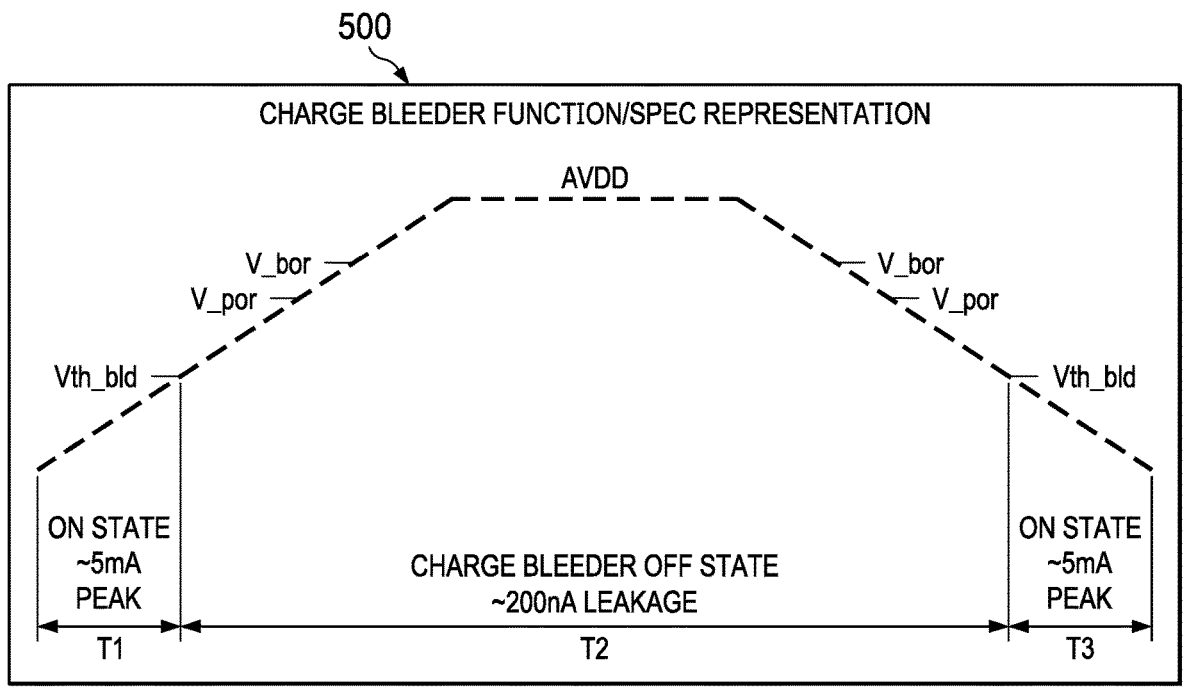
FIG. 5 shows an example of a timing diagram showing the voltage on a voltage supply line and the state of a circuit for bleeding voltage from a supply line of a device in a power down state, in accordance with embodiments of the present disclosure.

FIG. 5 shows an example of a timing diagram 500, according to embodiments of the present disclosure. Diagram 500 may illustrate operation of, for example, circuit 400. Diagram 500 may show the voltage on a voltage supply line and the state of a circuit (such as circuit 400) for bleeding undesirable voltage from a device in a power down state in accordance with some embodiments of the disclosed subject matter. When the voltage is at or below about the threshold voltage of transistors in the device during time period T1, the circuit is in an ON state in which a path between the supply line (e.g., supply line 404) and ground is completed (e.g., through control of transistor 410). In the ON state, the voltage on the supply line can be reduced via a current flowing through a bleeder circuit (e.g., resistor 406, transistor 408 and transistor 410). However, when the voltage on the supply line is above the threshold voltage of transistors in the device during time period T2, the circuit is in an OFF state and voltage on the line can be maintained with relatively small losses through the bleeder circuit (e.g., on the order of hundreds of nanoamps). Finally, during time period T3, the circuit is again in the ON state in which it actively bleeds voltage from the supply line. As shown in FIG. 5, the peak current through the charge bleeder circuit is about five mA, but this is merely an example and the circuit can be implemented to have any suitable peak current (e.g., by selecting the value of resistor 406).

Figure 6:
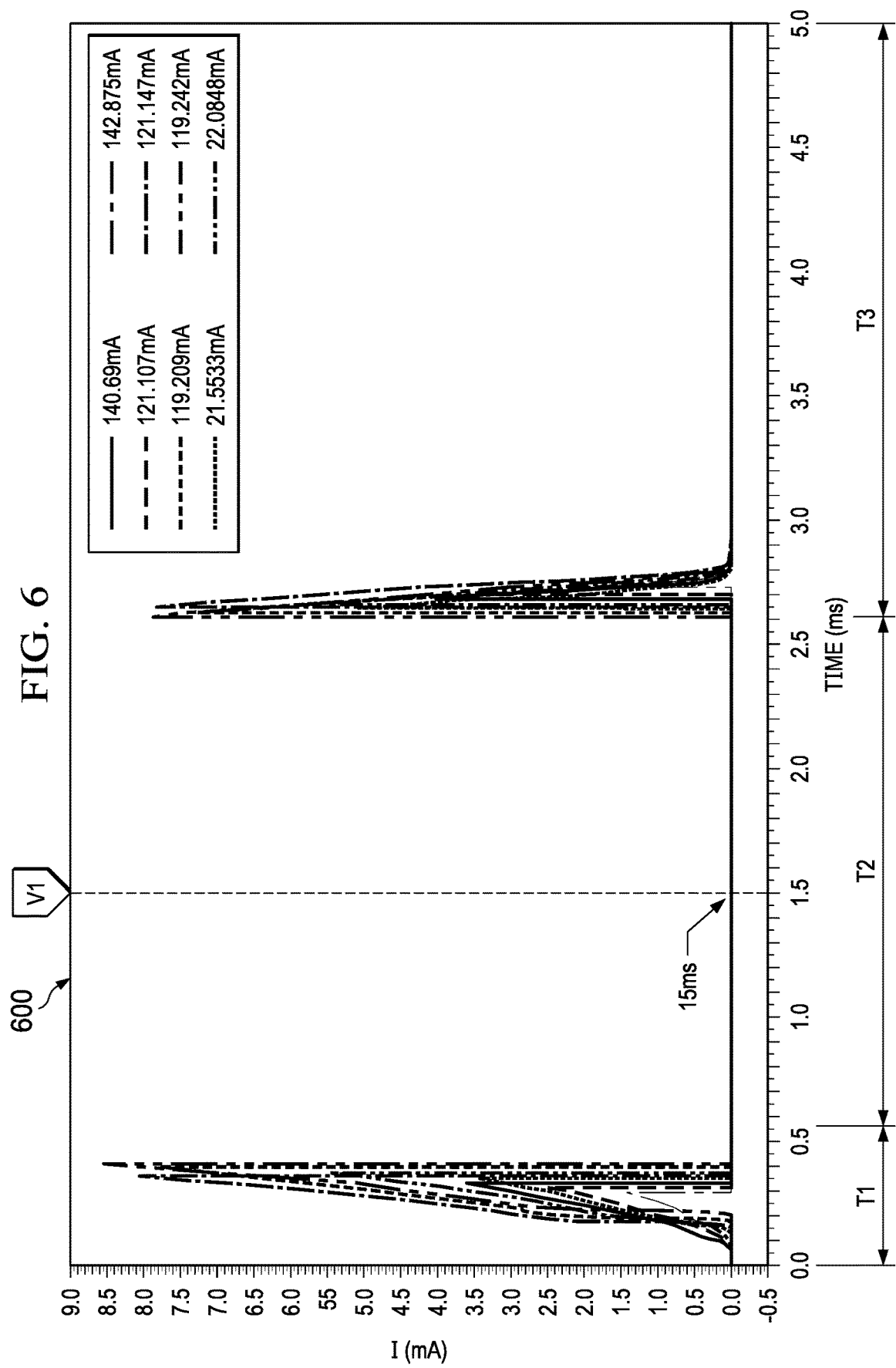
FIG. 6 shows examples of measured currents passing through the bleeder circuit during the time periods described above in connection with FIG. 5, in accordance with embodiments of the present disclosure.

FIG. 6 is a diagram 600 of measured currents passing through the bleeder circuit during the time periods described above in connection with FIG. 5, according to embodiments of the disclosed subject matter. As shown in FIG. 6, current peaks during times when the bleeder circuit is in an ON state (i.e., time periods T1 and T3) before falling toward zero as the voltage on the supply line is reduced and/or as the voltage on the supply line rises above Vth at the transition to time period T2. As also shown in FIG. 6, the current consumption during time period T2 while the bleeder circuit is OFF is near zero, showing that leakage is negligible.

Figure 7:
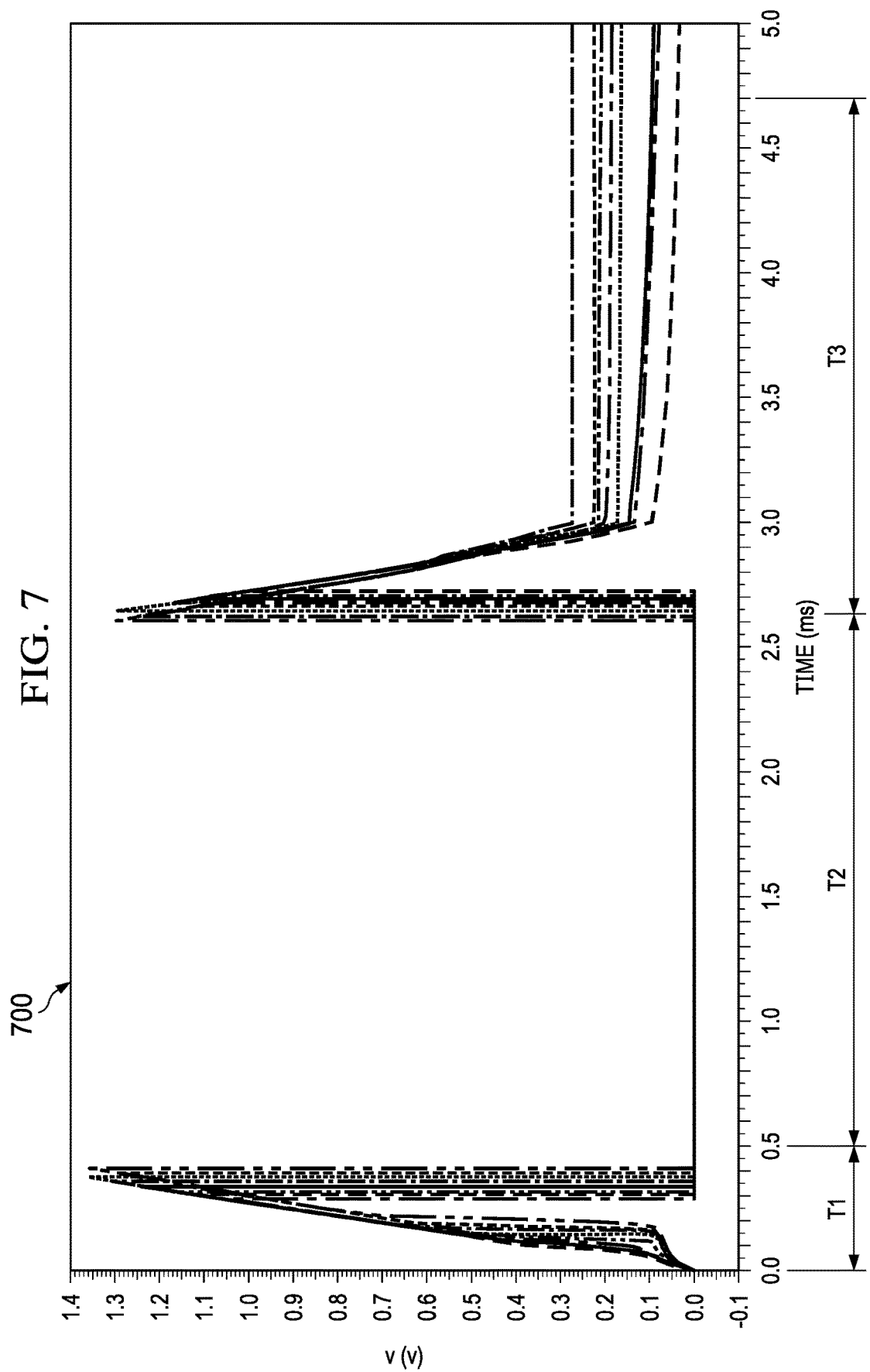
FIG. 7 shows examples of measured voltages on the control line used as an input to the gates of one or more transistors in the bleeder circuit during the time periods described above in connection with FIG. 5, in accordance with embodiments of the present disclosure.

FIG. 7 is a diagram 700, according to embodiments of the present disclosure. Diagram 700 illustrates measured voltages on the control line used as an input to the gates of one or more transistors in the bleeder circuit during the time periods described above in connection with FIG. 5. As shown in FIG. 7, the control voltage rises during times when the voltage on the supply line is below Vth causing the bleeder circuit to be in an ON state (i.e., time periods T1 and T3). As also shown in FIG. 7, the voltage on the control line of the bleeder circuit during time period T2 while the bleeder circuit is OFF is at or near zero.

The present disclosure has been described in terms of one or more embodiments, and it should be appreciated that many equivalents, alternatives, variations, and modifications, aside from those expressly stated, are possible and within the scope of the disclosure. While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

We claim:
1. An apparatus, comprising:
   a voltage supply line;
   a sense circuit coupled to the voltage supply line, the sense circuit configured to sense a voltage level of the voltage supply line; and
   a bleeder circuit configured to bleed a remaining charge available on a capacitor when the voltage level reaches a device threshold voltage, the device threshold voltage arising from a device connected to the apparatus, the bleeder circuit including:
      a resistor including a first side coupled to the voltage supply line;
      a first transistor having a first terminal coupled to a second side of the resistor; and
      a second transistor having a first terminal coupled to a second terminal of the first transistor, a second terminal coupled to ground, wherein the gate of the second transistor is communicatively coupled to the output of the sense circuit through a coupling capacitor.

2. The apparatus of claim 1, further comprising a control circuit coupled to the sense circuit and the bleeder circuit, the control circuit configured to:
   detect that a value of the voltage supply line is less than or equal to the device threshold voltage; and
   in response to detecting that the value of the voltage supply line is less than or equal to the device threshold voltage, output a control signal configured to allow current to flow between the voltage supply line and ground.

3. The apparatus of claim 1, further comprising a control circuit coupled to the sense circuit and the bleeder circuit, the control circuit configured to:
   detect that a voltage on the voltage supply line is greater than a device threshold voltage of transistors in the device; and
   in response to detecting that the voltage on the voltage supply line is greater than the device threshold voltage of transistors in the device, output a control signal configured to inhibit current flow between the voltage supply line and ground.

4. The apparatus of claim 2, wherein the sense circuit and the control circuit are implemented within a same circuit.

5. The apparatus of claim 2, wherein the control circuit comprises a Schmitt trigger.

6. The apparatus of claim 1, wherein the second transistor includes a transistor threshold voltage that is less than the device threshold voltage.

7. The apparatus of claim 1, wherein the second transistor includes a gate communicatively coupled to an output of the control circuit.

8. The apparatus of claim 1, wherein the first transistor is a medium voltage native transistor with a very low threshold voltage.

9. The apparatus of claim 1, wherein
   the second transistor is a low voltage transistor.

10. A method, comprising:
    sensing, with a sense circuit, a voltage level of a voltage supply line on an apparatus; and
    bleeding, with a bleeder circuit, a remaining charge available on a capacitor when the voltage level reaches a device threshold voltage, the device threshold voltage arising from a device connected to the apparatus, by, within the bleeder circuit:
       coupling a first side of a to the voltage supply line;
       coupling a first terminal of a first transistor to a second side of the resistor;
       coupling a first terminal of a second transistor to a second terminal of the first transistor;

coupling a second terminal of the second transistor to ground; and communicatively coupling the gate of the second transistor to the output of the sense circuit through a coupling capacitor.

11. The method of claim 10, further comprising:

detecting that a value of the voltage supply line is less than or equal to the device threshold voltage; and in response to detecting that the value of the voltage supply line is less than or equal to the device threshold voltage, outputting a control signal configured to allow current to flow between the voltage supply line and ground.

12. The method of claim 10, further comprising:

detecting that a voltage on the voltage supply line is greater than a device threshold voltage of transistors in the device; and in response to detecting that the voltage on the voltage supply line is greater than the device threshold voltage of transistors in the device, outputting a control signal configured to inhibit current flow between the voltage supply line and ground.

13. The method of claim 10, wherein the device is a flash memory, and further comprising preserving a read/write state of the flash memory depending upon an on/off state of the flash memory as detected through the voltage supply line.

* * * * *